United States Patent
Steckler et al.

(10) Patent No.: US 7,711,342 B2
(45) Date of Patent: May 4, 2010

(54) SIGNAL ADJUSTMENT TECHNIQUES

(75) Inventors: Steven A. Steckler, Clark, NJ (US); Saeed Abbasi, Narberth, PA (US)

(73) Assignee: Pine Valley Investments, Inc., Las Vegas, NV (US)

( * ) Notice: Subject to any disclaimer, the term of this patent is extended or adjusted under 35 U.S.C. 154(b) by 581 days.

(21) Appl. No.: 11/679,599

(22) Filed: Feb. 27, 2007

(65) Prior Publication Data
US 2008/0204106 A1  Aug. 28, 2008

(51) Int. Cl.
H04B 1/10  (2006.01)
H04B 1/16  (2006.01)

(52) U.S. Cl. .............. 455/296; 455/299; 455/306; 455/339; 375/350

(58) Field of Classification Search ........ 455/63.1, 455/67.13, 283–286, 295, 296, 298–299, 455/305–312, 338–340; 375/317–319, 346, 375/348–350
See application file for complete search history.

(56) References Cited

U.S. PATENT DOCUMENTS

| | | | | |
|---|---|---|---|---|
| 5,867,777 A | * | 2/1999 | Yamaji et al. | 455/234.1 |
| 6,016,075 A | * | 1/2000 | Hamo | 330/10 |
| 6,335,656 B1 | | 1/2002 | Goldfarb et al. | |
| 7,139,547 B2 | * | 11/2006 | Wakayama et al. | 455/333 |
| 7,171,185 B2 | * | 1/2007 | Matsumoto et al. | 455/324 |
| 7,215,722 B2 | * | 5/2007 | Hsiao | 375/319 |
| 7,260,373 B2 | * | 8/2007 | Akamine et al. | 455/234.1 |
| 7,403,760 B1 | * | 7/2008 | Gao | 455/312 |
| 2002/0037706 A1 | * | 3/2002 | Ichihara | 455/324 |
| 2005/0110550 A1 | * | 5/2005 | Shi et al. | 327/307 |
| 2005/0221783 A1 | * | 10/2005 | Pan | 455/302 |
| 2008/0026719 A1 | * | 1/2008 | Chiu et al. | 455/296 |

* cited by examiner

*Primary Examiner*—Simon D Nguyen
(74) *Attorney, Agent, or Firm*—Allen, Dyer, Doppelt, Milbrath & Gilchrist, P.A.

(57) ABSTRACT

An apparatus includes a filter module, an amplification module, and an adjustment signal source. The filter module generates a filtered signal based on a received signal. This filtered signal has a level shift corresponding to a difference between a direct current (DC) level of the filtered signal and a DC level of the received signal. From the filtered signal and an adjustment signal, the amplification module generates an amplified signal. The adjustment signal, which is provided by the adjustment signal source, may control (e.g., diminish) an effect of the level shift on a DC level of the amplified signal.

16 Claims, 8 Drawing Sheets

SIGNAL ADJUSTMENT TECHNIQUES

BACKGROUND

Devices that receive radio frequency (RF) signals often employ a down-conversion mixer or detector circuit to produce a signal at a lower frequency range. This signal may be at an intermediate frequency (IF), or at baseband when direct conversion techniques are employed.

To increase its alternating current (AC) level, a detected signal may be sent to an amplifier. Additionally, one or more filters (e.g., low pass or band pass filters) are conventionally placed between the output of the mixer or detector and the input of the amplifier. Such filters may separate relatively low-frequency modulation components in the signal from residual RF components, and limit the signal processing bandwidth to reduce noise.

Conventional filter and amplifier arrangements typically block or degrade direct current (DC) signal components that are provided by the detection circuit. For example, certain conventional arrangements incorporate high pass filters to block the DC offsets that are byproducts of a homodyne detector configuration.

Such blocking of DC signal components can lead to several disadvantages. These disadvantages may include a loss of static phase information, a loss of loop stability, an impairment of system transient response, as well as a degradation of other system parameters.

SUMMARY

The present invention provides various embodiments. For instance, an apparatus may include a filter module, an amplification module, and an adjustment signal source. The filter module generates a filtered signal based on a received signal. This filtered signal has a level shift corresponding to a difference between a direct current (DC) level of the filtered signal and a DC level of the received signal. From the filtered signal and an adjustment signal, the amplification module generates an amplified signal. The adjustment signal, which is provided by the adjustment signal source, may control (e.g., diminish) an effect of the level shift on a DC level of the amplified signal.

A further apparatus may include a filter circuit and a operational amplifier (op-amp). The filter circuit generates a filtered signal based on a received signal. This filtered signal has a level shift corresponding to a difference between a direct current (DC) level of the filtered signal and a DC level of the received signal. The op-amp has an input terminal and an output terminal. A first resistance is coupled between the input terminal and a first node to receive the filtered signal. Also, a second resistance is coupled between the input terminal and a second node to receive an adjustment signal. Additionally, a third resistance is coupled between the input terminal and the output terminal.

A method may generate a filtered signal from a received signal, provide an adjustment signal, and generate an amplified signal from the filtered signal and the adjustment signal. The filtered signal has a level shift corresponding to a difference between a direct current (DC) level of the filtered signal and a DC level of the received signal. The adjustment signal is to control an effect of the level shift on a DC level of the amplified signal.

A further method may provide operational power to one or more components associated with the reception of signals from a transmission medium, and isolate one or more components from the signal transmission medium. In addition, the method may determine one or more voltage level shifts within the components, and generate one or more adjustment signals. These one or more adjustment signals are to control one or more effects of the one or more detected voltage level shifts.

DETAILED DESCRIPTION

Various embodiments may be generally directed to signal adjustment techniques. For example, embodiments may provide desirable DC coupling between input and output signals in RF systems. Such input signals may be received from a mixer or detector, and such output signals may be output from an intermediate frequency (IF) or baseband amplifier. However, the embodiments are not limited to such contexts.

This DC coupling may advantageously reduce signal loss in the generation of output signals. In addition, embodiments may control level shifts in such signals for improved system performance. Thus, embodiments may extend low-frequency limits of signal coupling to DC, while still interfacing two DC signal levels that may be substantially different.

Embodiments can reduce signal loss at DC to zero or some larger non-zero value, as required by a particular system's operation. Moreover, in addition to correcting level shifts, embodiments may adjust DC level shifts to desired amounts. Further features and advantages will become apparent from the following description and accompanying drawings.

Although embodiments may be described with a certain number of elements in a particular arrangement by way of example, the embodiments are not limited to such examples. For instance, embodiments may include greater or fewer elements, as well as other arrangements among elements.

Figure 1:
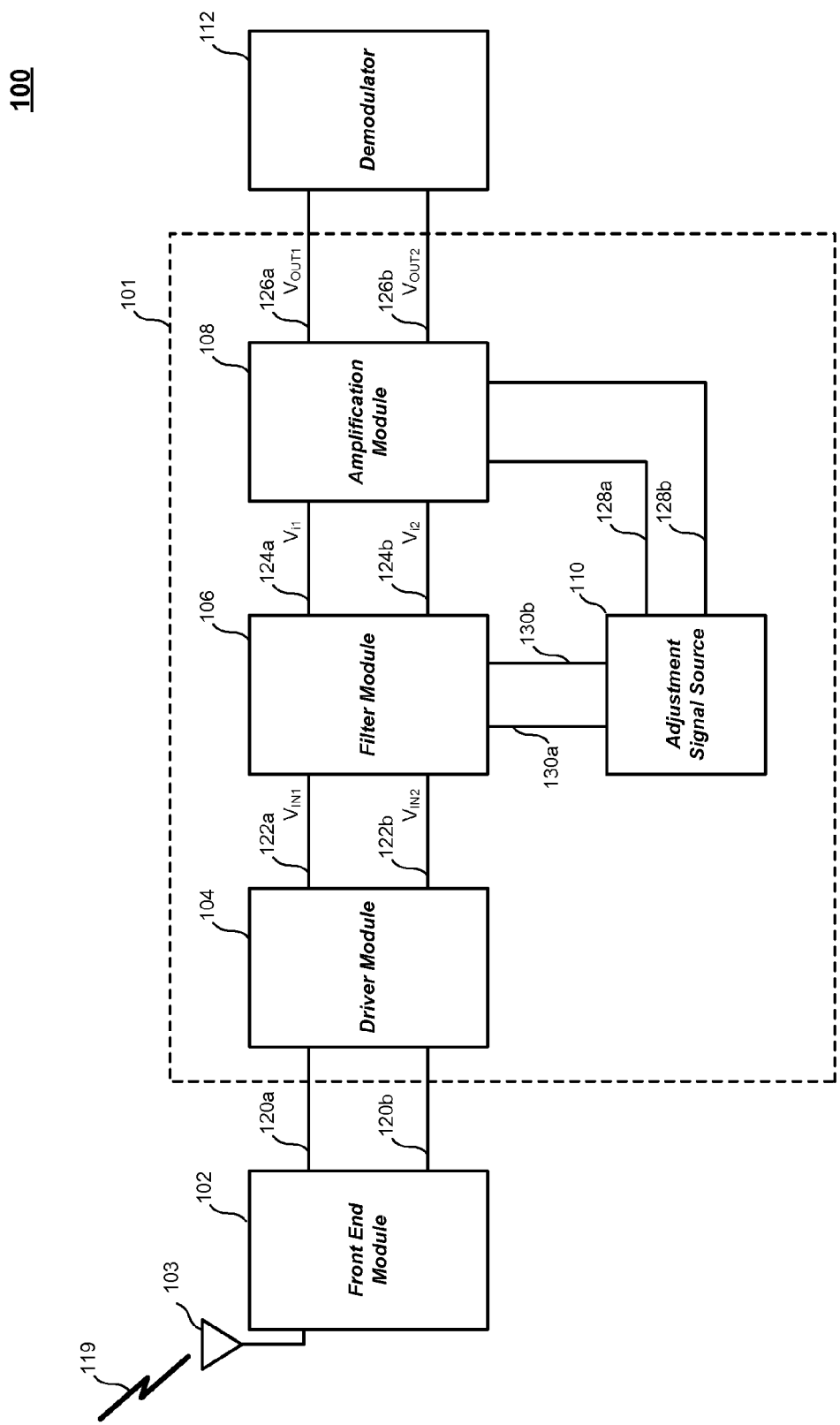
FIG. 1 illustrates an embodiment of a system that may process received signals.

FIG. 1 illustrates one embodiment of a system that may process received signals. In particular, FIG. 1 shows a system 100 comprising various elements. The embodiments, however, are not limited to these depicted elements. As shown in FIG. 1, system 100 may include a front end module 102, a driver module 104, a filter module 106, an amplification module 108, an adjustment signal source 110, and a demodulator 112.

Front end module 102 receives a wireless radio frequency (RF) signal 119 through an antenna 103. This signal may be modulated according to various technique(s) and be within a particular frequency range. Alternatively, RF signal 119 may be a signal received from a wired (e.g., cable) medium. From RF signal 119, front end module 102 produces a differential and/or balanced input signal pairing. FIG. 1 shows that this signal pairing includes input signals (also referred to as signal components) 120a and 120b.

Input signals 120a and 120b may be at baseband. Thus, front end module 102 may perform a direct down-conversion (or direct conversion) of RF signal 119. Alternatively, input signals 120a and 120b may be at an intermediate frequency (e.g., through downconversion and/or upconversion techniques). To generate input signals 120a and 120b, front end module 102 may include various components. Exemplary components include a low noise amplifier (LNA), a band pass filter, and a mixer or detector circuit.

Moreover, input signals 120a and 120b may each have a DC component (also referred to as a DC level). These DC levels may be desirable to retain for various reasons. For instance, the DC levels may support the performance of certain elements, such as demodulator 112. More particularly, the DC levels may convey static phase information, promote loop stability, ensure an adequate system transient response, as well as provide other attributes.

As shown in FIG. 1, driver module 104, filter module 106, amplification module 108, and adjustment signal source 110 may be included in an apparatus 101.

Driver module 104 receives signals 120a and 120b and generates corresponding signals 122a and 122b (also shown as $V_{IN1}$ and $V_{IN2}$). To drive subsequent modules (e.g., filter module 106 and amplification module 108), driver module 104 may provide signals 122a and 122b at relatively low output impedances.

Driver module 104 may be implemented with various electronic components, such as one or more transistors. For example, driver module 104 may utilize bipolar junction transistors (BJTs) in emitter follower circuits that receive signals 122a and 122b. However, other semiconductor technologies may be employed. Exemplary technologies include complementary metal oxide semiconductor (CMOS), Silicon Germanium (SiGe), and so forth. Further, combinations of technologies may be employed. Also, embodiments may omit driver module 104.

FIG. 1 shows that signals 122a and 122b are sent to filter module 106. From these signals, filter module 106 generates filtered signals 124a and 124b (also shown as $V_{f1}$ and $V_{f2}$). In direct conversion implementations where signals 122a and 122b are baseband signals, filter module 106 may perform low pass filtering on signals 122a and 122b to generate filtered signals 124a and 124b. However, in other implementations (such as ones where signals 122a and 122b are at intermediate frequencies), filter module 106 may perform band pass and/or high pass filtering.

Filtered signals 124a and 124b each have a DC component (or DC level). These DC levels may be different than the DC levels of input signals 120a and 120b. Such differences are referred to herein as level shifts. More particularly, a first level shift is characterized by a difference between signals 124a and 120a. Also, a second level shift is characterized by a difference between signals 124b and 120b. These level shifts may arise through voltage drops occurring across one or more electronic components. Such components may include resistances, transistors, diodes, as well as other devices.

In addition, such level shifts may arise in front end module 102. For example, front end module 102 may include a homodyne reception circuit having a local oscillator (LO) to provide a mixer with a carrier reference signal. This reference signal is at the same frequency as the input signal (e.g., RF signal) received by the mixer. Therefore, leakage from the LO into the input signal will cause a DC voltage shift at the output of the mixer. Such level shifts may be present in signals 120a and 120b.

For the differential or balanced signals of FIG. 1, such level shifts may also be manifested as corresponding DC level shifts in the sum of signal pairings. However, in embodiments employing single-ended signals, such level shifts may manifest themselves as plain DC shifts (e.g., common mode shifts) of such signals.

As shown in FIG. 1, filtered signals 124a and 124b are sent to amplification module 108. In turn, amplification module 108 generates amplified signals 126a and 126b (also shown as $V_{OUT1}$ and $V_{OUT2}$), which may be sent to demodulator 112. From these signals, demodulator 112 may generate a symbol sequence (not shown) by employing one or more demodulation techniques.

As shown in FIG. 1, adjustment signal source 110 generates adjustment signals 128a and 128b. Also, adjustment signal source 110 may generate further adjustment signals 130a and 130b. These adjustment signals may be preconfigured and/or static. Alternatively, adjustment signal source 110 may automatically or dynamically set based on operating conditions and/or user input. Such automatic or dynamic setting of adjustment signals may occur, for example, during initialization, power-up, calibration, and/or recalibration procedures.

As described above, embodiments may control effects of level shifts in various signals. For instance, adjustment signals 128a and 128b may be sent to amplification module 108. As a result, amplification module 108 may produce amplified signals 126a and 126b having controlled or adjusted level shifts. In addition, further adjustment signals 130a and 130b may also be employed to control level shifts exhibited in filtered signals 124a and 124b.

FIG. 1 has been described in the context of differential and/or balanced signals. However, these elements may be implemented to generate and process single-ended signals. In such implementations, each balanced signal pairing (or pairing of signal components) is replaced with a corresponding individual signal.

Figure 2:
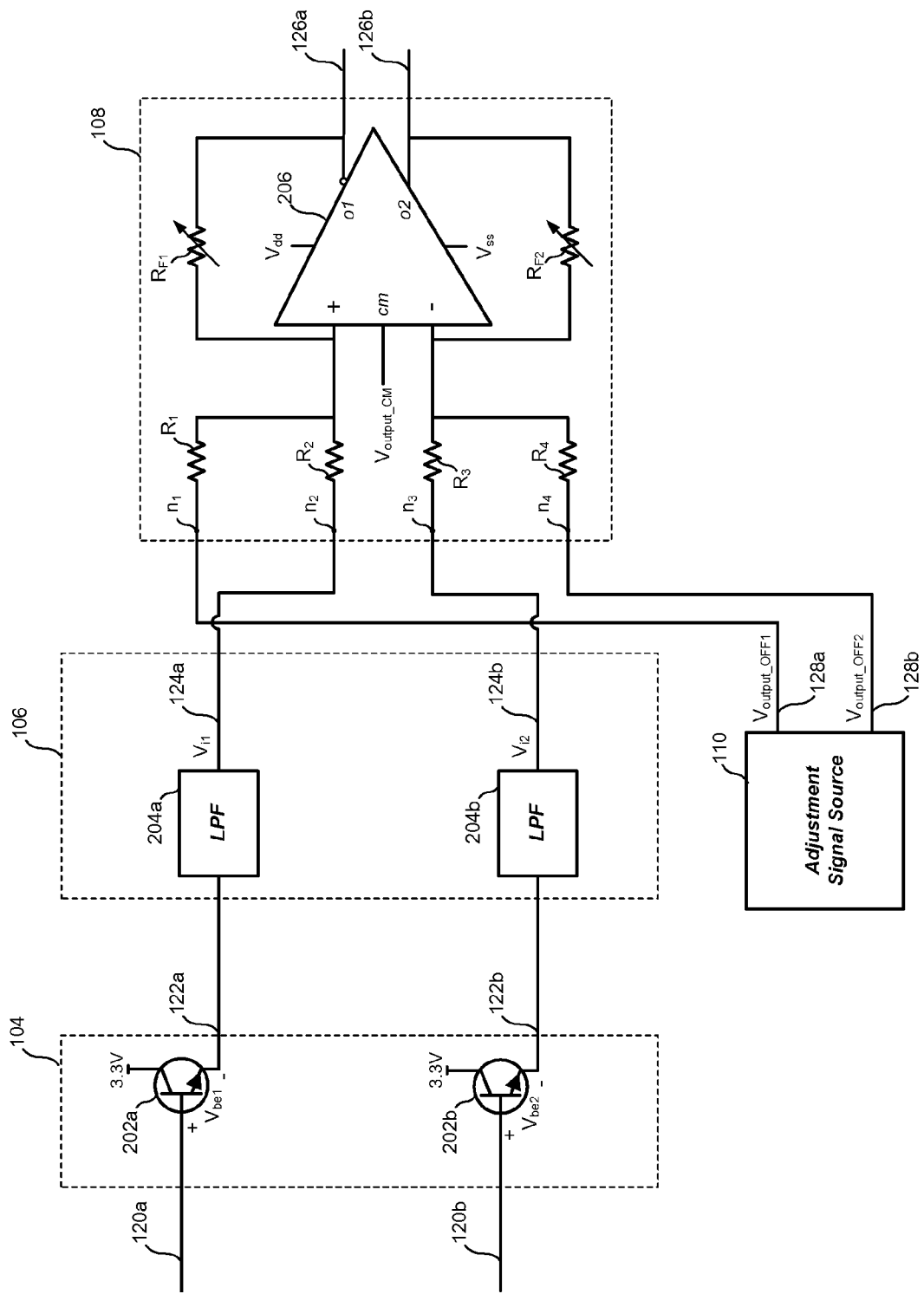
FIG. 2 is a diagram of an exemplary apparatus implementation.

FIG. 2 is a diagram showing an exemplary implementation 200 of elements within apparatus 101 of FIG. 1. As shown in FIG. 2, driver module 104 may include transistors 202a and 202b in emitter follower arrangements. More particularly, transistors 202a and 202b receive, at their base terminals, input signals 120a and 120b, respectively. Based on these input signals, transistors 202a and 202b provide signals 122a and 122b at their respective emitter terminals. FIG. 2 shows that the collector terminals of transistors 202a and 220b are driven by signals derived from a 3.3V DC power supply. However, other voltages may be employed.

Voltage drops $V_{be1}$ and $V_{be2}$ occur at transistors 202a and 202b. These voltage drops contribute to a DC signal decoupling between input signals 120a-b and filtered signals 124a-b. Thus, these voltage drops are components of DC level shifts, as described herein.

As a result of such drops, the common mode voltage of signals 120a and 120b may differ substantially from the common mode voltage of signals 122a and 122b. For instance, exemplary common mode voltages are approximately 2.7 volts for signals 120a and 120b and approximately 0.9 volts for signals 122a and 122b (as well as signals 124a and 124b).

Filter module 106 includes low pass filters (LPFs) 204a and 204b. FIG. 2 shows that LPF 204a generates filtered signal 124a from signal 122a, while LPF 204b generates filtered signal 124b from signal 122b. However, the embodiments are not limited to these values.

Amplification module 108 receives filtered signals 124a and 124b. In addition, amplification module 108 receives adjustment signals 128a and 128b (also shown in FIG. 2 as $V_{output\_OFF1}$ and $V_{output\_OFF2}$) from adjustment signal source 110.

Amplification module 108 may include an operational amplifier (op-amp) 206. As shown in FIG. 2, op-amp 206 has a non-inverting input terminal (labeled as '+') and an inverting input terminal (labeled as '−'). Also, op-amp 206 has output terminals o1 and o2 that provide output signals 126a and 126b, respectively. Output terminal o1 is an inverting output, while output terminal o2 is a non-inverting output.

FIG. 2 shows that op-amp 206 further includes a terminal, cm, that receives a voltage, $V_{output\_CM}$. This voltage sets the common mode voltage of output signals 126a and 126b. In addition, Op-amp 206 also includes terminals that receive operational voltages $V_{dd}$ and $V_{ss}$.

Various elements may be coupled to the terminals of op-amp 206. For instance, FIG. 2 shows a resistance $R_1$ coupled between the non-inverting input terminal and a node $n_1$. Also, a resistance $R_2$ is coupled between the non-inverting input terminal and a node $n_2$. Coupled between the inverting input terminal and a node $n_3$ is a resistance $R_3$. Additionally, a resistance $R_4$ is coupled between the inverting input terminal and a node $n_4$.

FIG. 2 further shows variable feedback resistances $R_{F1}$ and $R_{F2}$. Resistance $R_{F1}$ is coupled between the non-inverting input node and output terminal o1, while resistance $R_{F2}$ is coupled between the inverting input node of op-amp 206 and output terminal o2.

Nodes $n_1$-$n_4$ receive adjustment signals and filtered signals. More particularly, FIG. 2 shows that node $n_1$ receives adjustment signal 128a, node n2 receives filtered signal 124a, node $n_3$ receives filtered signal 124b, and node $n_4$ receives adjustment signal 128b.

Resistances $R_1$, $R_2$, and $R_{F1}$, $R_3$, $R_4$, and $R_{F2}$ (as well as the open loop gain of op-amp 206) determine an amplification gain for the amplification of signals 124a-b into output signals 126a-b. Moreover, in conjunction with adjustment signals 128a-b, these resistances establish DC levels for output signals 126a and 126b.

The resistances shown in FIG. 2 may have a variety of values. Exemplary values include 2 kilo ohms (kΩ) for each of resistances $R_1$, $R_2$, $R_3$, and $R_4$. $R_{F1}$ and $R_{F2}$ may be set to vary, for example, between 2 kΩ and 50 kΩ.

Figure 3B:
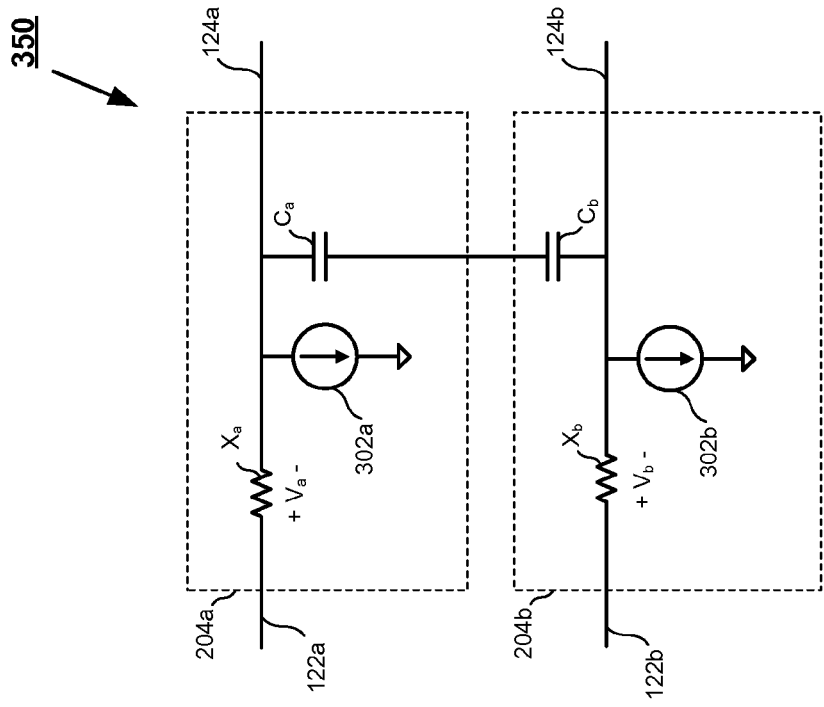
FIGS. 3A and 3B are diagrams of exemplary low pass filter arrangements.
Figure 3A:
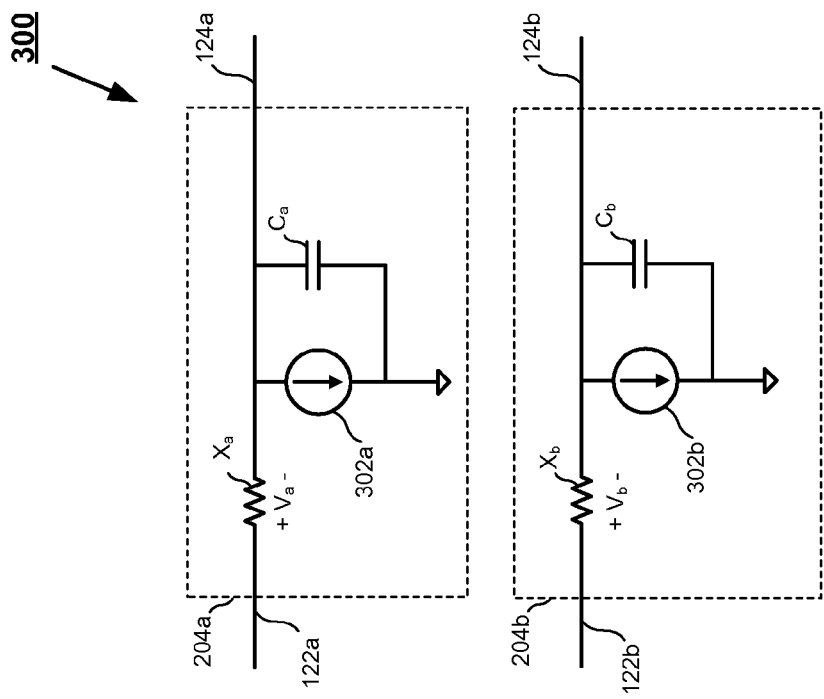

FIGS. 3A and 3B are diagrams of exemplary low pass filter arrangements for LPFs 204a and 204b. FIG. 3A shows an arrangement 300. In this arrangement, low pass filters 204a and 204b each include a resistance, a capacitance, and a current source. More particularly, FIG. 3A shows LPF 204a having a resistance $X_a$, a capacitance $C_a$, and a current source 302a. Similarly, FIG. 3A shows LPF 204b having a resistance $X_b$, a capacitance $C_b$, and a current source 302b. For each of LPFs 204a and 204b, the capacitance and current source are coupled in parallel between their corresponding resistance (i.e., either $X_a$ or $X_b$) and a ground node.

FIG. 3B shows an alternative arrangement 350 for LPFs 204a and 204b. This arrangement is similar to the arrangement of FIG. 3A. However, instead of being coupled to a ground node, capacitances $C_a$ and $C_b$ are each coupled between their corresponding resistance and each other. Alternatively, a single capacitance may be used instead of $C_a$ and $C_b$. This capacitance may be substantially equal to the series combination of $C_a$ and $C_b$. However, other values may alternatively be employed.

As described herein, DC level shifts associated with filtered signals 124a and 124b may include various components. With reference to FIGS. 3A and 3B, such components may include voltage drops $V_a$ and $V_b$ across resistances $X_a$ and $X_b$, respectively.

In embodiments, such voltage drops may be regulated. For instance, $V_a$ and $V_b$ may be maintained at certain levels or within certain ranges to regulate the DC voltage levels of filtered signals 124a and 124b. This may provide for DC level shifts associated with filtered signals 124a and 124b to be within a certain range for adjustment by adjustment signals 128a and 128b.

The filter implementations described above with reference to FIGS. 3A and 3B are provided as examples, and not as limitations. Thus other filter implementations may be employed. For example, low pass, high pass, and/or band pass filters may be employed. Such filters may be implemented as single-pole or higher order RC filters. Also, more complex structures, such as active or switched-capacitor filters, may be employed.

In embodiments, high-pass and band-pass filter implementations may furnish a DC path to provide a mechanism for level shifting or DC coupling.

Figure 4:
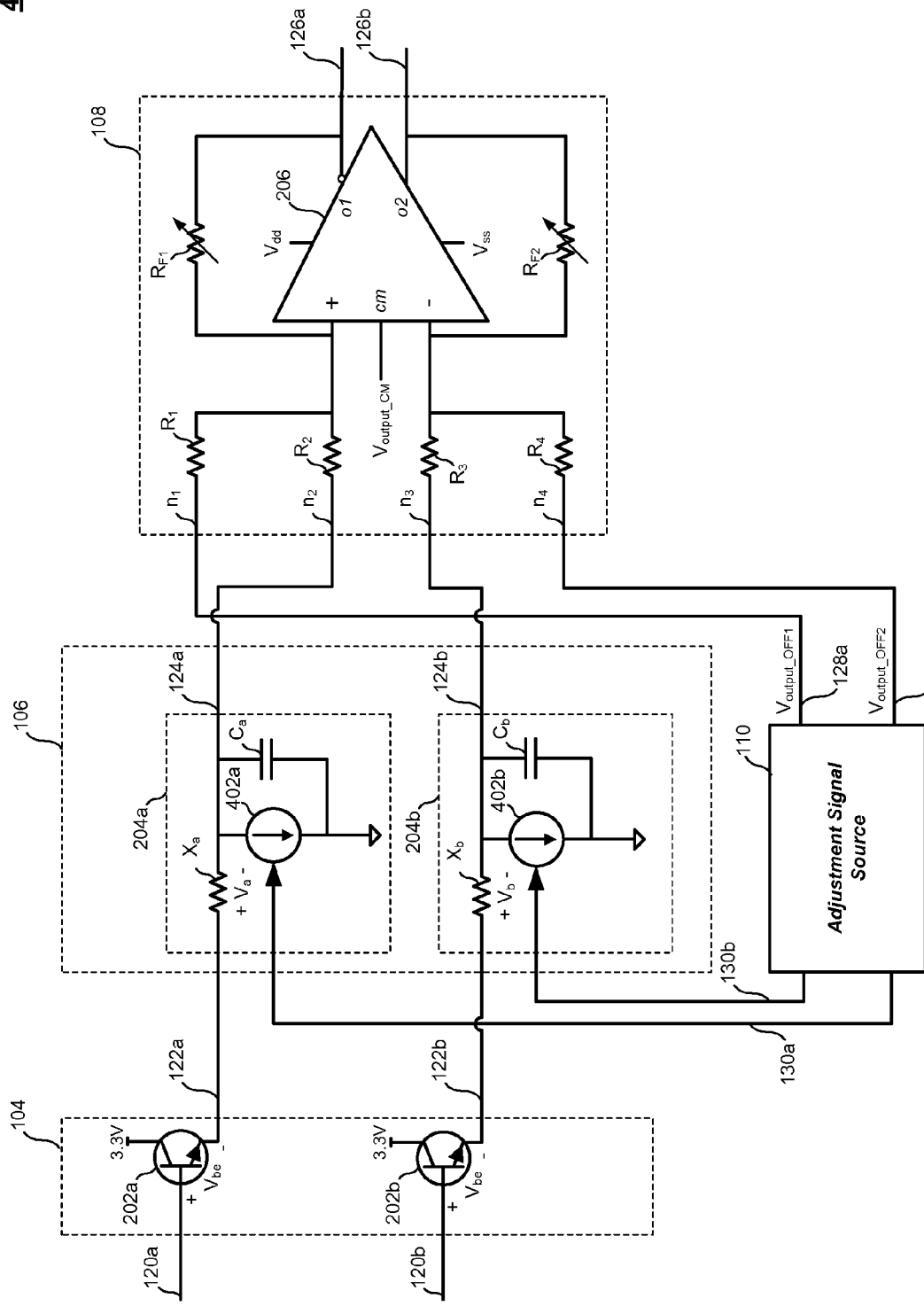
FIG. 4 is a diagram of an arrangement employing variable current sources.

FIG. 4 provides an example of an implementation in which voltage drops occurring within filter modules 204a and 204b are controlled. In particular, FIG. 4 shows an implementation 400 of apparatus 101. This implementation, which is similar to implementation 200 of FIG. 2, shows LPFs 204a and 204b implemented in the manner of FIG. 3A. However, LPF 204a includes a variable current source 402a and LPF 204b includes a variable current source 402b. The amount of current generated by current sources 402a and 402b is controlled by adjustment signals 130a and 130b. By controlling these currents, voltage drops $V_a$ and $V_b$ may, in turn, be controlled.

Although FIG. 4 shows the filter arrangement of FIG. 3A, other arrangements (e.g., the arrangement of FIG. 3B, and so forth) may employ variable current sources. Thus, the embodiments are not limited to this context. Moreover, techniques other than variable current sources may be employed to vary voltage drops within filters.

As described above with reference to FIG. 1, apparatus 101 may include an adjustment signal source 110 to generate signals 128a-b and/or 130a-b. Adjustment signal source 110 may be implemented in various ways. An exemplary implementation I shown in FIG. 5.

Figure 5:
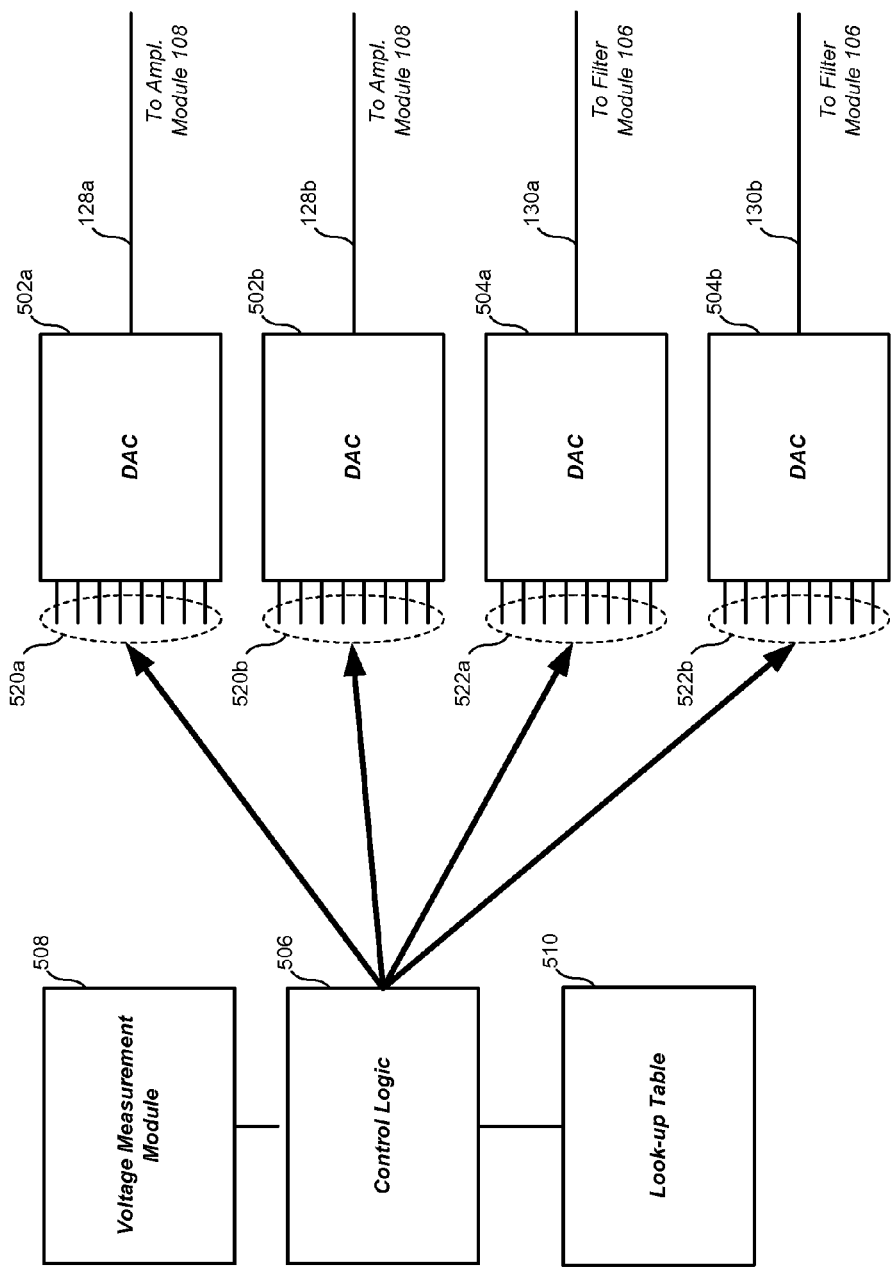
FIG. 5 is a diagram of an exemplary adjustment signal source implementation.

In particular, FIG. 5 shows an implementation 500 that may include control logic 506, a voltage measurement module 508, and a look-up table (LUT) 510. In addition, implementation 500 may include multiple digital to analog converters (DACs). These include a first DAC 502a, a second DAC 502b, a third DAC 504a, and a fourth DAC 504b.

Control logic 506 performs various operations in the generation of adjustment signals. For instance, control logic 506 may direct voltage measurement module 508 to measure one or more level shifts, as described herein. Further, control logic 506 may determine appropriate adjustment signal values based on such measurements. This determination may be made by retrieving adjustment signal values from look-up table 510. These adjustment signal values may be in the form of digital control words, which are sent to DACs 502a-b and 504a-b for the generation of adjustment signals 128a-b and 130a-b.

Also, control logic 506 may control the delivery of operational power to various components, devices, or elements (e.g., the elements shown in FIG. 1). Further, control logic 506 may provide for the disconnection or isolation of such components, devices, or elements from communications media. Such operations may be performed to provide for the establishment of adjustment signal values. Additionally, control logic 506 may direct components, devices, or elements to enter various power savings modes.

As described above, voltage measurement module 508 measures voltage drops across particular circuit nodes. Thus voltage measurement module 508 may provide leads or connections (not shown) to various circuit nodes. With reference to FIG. 1, voltage measurement module 508 may determine voltages between signals 120a and 124a, and signals 120b and 124b. Also, voltage measurement module 508 may determine voltages between signals 120a and 126a, and 120b and 126b. Further, voltage measurement module 508 may determine voltages between signals 120a and 122a, and signals 122a and 124a. Similarly, voltage measurement module 508 may determine voltages between signals 120b and 122b, and signals 122b and 124b. The embodiments, however, are not limited to these examples.

Alternatively, voltage measurement module 508 may determine levels of differential pairings, and calculate level shifts from these determined levels. More particularly, voltage measurement module 508 may combine (e.g., add) components of differential signal pairings to obtain corresponding levels. For example, with reference to FIG. 1, voltage measurement module 508 may: combine signals 126a and 126b to obtain an amplified signal level; combine signals 124a and 124b to obtain a filtered signal level, combine signals 122a and 122b to obtain a driven signal level, and/or combine signals 120a and 120b to obtain an input signal level. From such combinations, voltage measurement module 508 may calculate level shifts by computing differences between such combined signal levels.

Look-up table 510 stores correspondences between level shifts (e.g., measured voltage drops) and adjustment signal values. Thus, for a particular level shift measurement, look-up table 510 may provide a corresponding adjustment signal value. Look-up table 510 may store multiple sets of correspondences. For example, with reference to FIG. 1, look-up table 510 may store correspondences for each of adjustment signals 128a, 128b, 130a, and 130b DACs 502a and 502b generate analog adjustment signals 128a and 128b, respectively. As described above with reference to FIG. 1, these signals may be sent to amplification module 108. DACs 504a and 504b may generate further adjustment signals 130a and 130b, respectively. Referring to FIG. 1, these signals may be sent to filter module 106.

FIG. 5 shows that each of DACs 502a-b and 504a-b receives a digital control word from control logic 506. More particularly, FIG. 5 shows that DAC 502a receives a control word 520a, DAC 502b receives a control word 520b, DAC 504a receives a control word 522a, and DAC 504b receives a control word 522b. These control words determine the values of adjustment signals 128a-b and 130a-b.

As described above, control words 520a-b and 522a-b may be set or adjusted by, for example, control logic 506. Alternatively, control words 520a-b and 522a-b may be "hard-wired" to predetermined settings.

Elements of FIG. 5 may be implemented in hardware, software, firmware, or any combination thereof. For instance, one or more of these elements may include a storage medium (e.g., memory) containing instructions (e.g., software), and a processor that reads and executes these instructions. When executed, these instructions may control the generation of control words 520a-b and 522a-b.

Operations for the above embodiments may be further described with reference to the following figures and accompanying examples. Some of the figures may include a logic flow. Although such figures presented herein may include a particular logic flow, it can be appreciated that the logic flow merely provides an example of how the general functionality as described herein may be implemented. Further, the given logic flow does not necessarily have to be executed in the order presented, unless otherwise indicated. In addition, the given logic flow may be implemented by a hardware element, a software element executed by a processor, or any combination thereof. The embodiments are not limited in this context.

Figure 6:
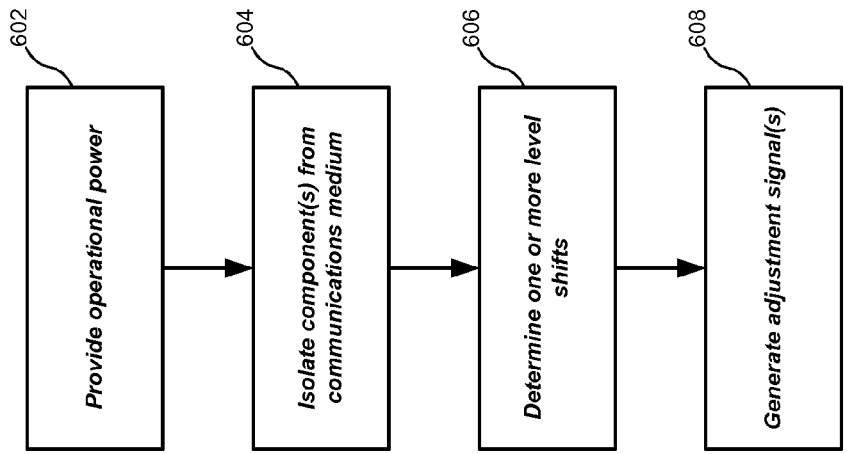
FIG. 6 is a diagram of a logic flow embodiment.

FIG. 6 illustrates an exemplary logic flow 600, which may be representative of operations executed by one or more embodiments described herein. This logic flow provides an example in which one or more adjustment signals are set. As described above, such signals may be set, for example, during initialization, power-up, calibration, and/or recalibration procedures.

As shown in block 602 of FIG. 6, operational power is provided to one or more reception components of a device or apparatus. For example, in the context of FIG. 1, operational power may be provided to apparatus 101. In addition, power may be provided to elements (such as front-end module 102) that perform down conversion or detection of received signals.

As indicated by a block 604, isolation from a corresponding signal transmission medium is provided. This medium may be wired or wireless. In the context of FIG. 1, for example, this may involve disconnecting antenna 103 from front-end module 102. Through this isolation, the reception of signals is prevented (or substantially attenuated). This allows for level shifts to be identified or measured at various points in the apparatus or device.

A block 606 indicates that one or more level shifts are determined. This may involve measuring one or more potential differences (voltage drops) between different points or nodes in the apparatus or device. Alternatively, voltage measurement module 508 may determine levels of differential pairings, and calculate level shifts from these determined levels. More particularly, voltage measurement module 508 may combine (e.g., add) components of differential signal pairings to obtain corresponding levels. From such combinations, voltage measurement module 508 may calculate level shifts by computing differences between such combined signal levels. With reference to FIG. 5, such measurement(s) and calculation(s) may be made by voltage measurement module 508.

Referring again to FIG. 1, a level shift may be determined through measuring a potential difference between signals 120a and 124a. Similarly, a level shift may be determined through measuring a potential difference between signals 120b and 124b. Alternatively or additionally, other level shifts may be determined. For example, potential differences (voltages) may be determined between signals 120a and 122a, and signals 122a and 124a. Similarly, potential differences may be determined between signals 120b and 122b, and signals 122b and 124b.

Based on the one or more determined level shifts, one or more adjustment signals may be generated (as indicated by block 608). This may comprise identifying value(s) for the one or more adjustment signals. With reference to FIG. 5, such value(s) may be identified by accessing look-up table 510 in accordance with the determined level shift(s). Also, the generation of adjustment signal(s) may involve setting control words 520a-b and 522a-b to particular values. Accordingly, such features may be implemented with control logic 506.

Figure 7:
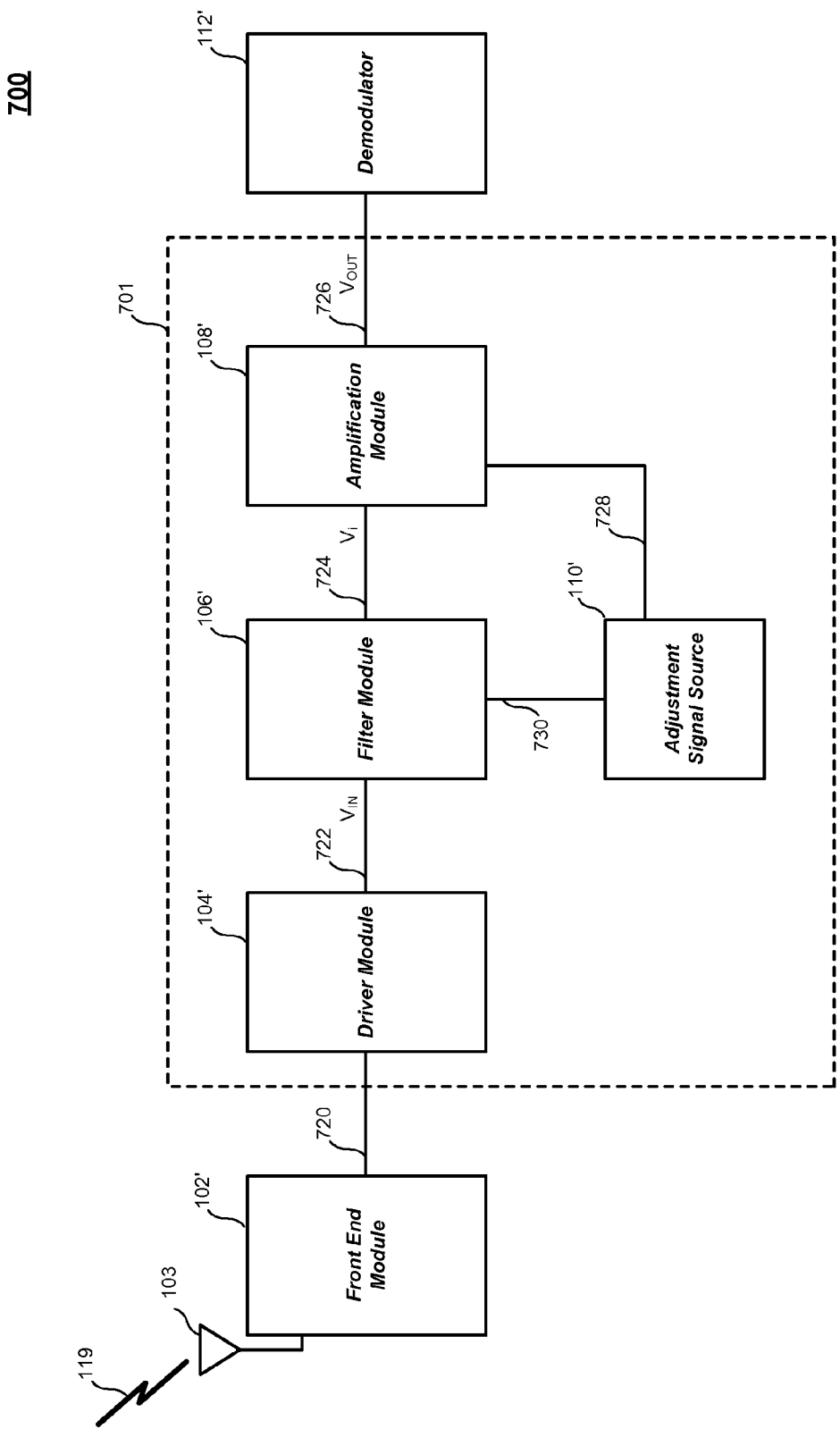
FIG. 7 illustrates a further system embodiment.

As described above, embodiments are not limited to the employment of balanced or differential circuits. Accordingly, FIG. 7 is a diagram of an exemplary embodiment 700, which may be used to process received signals. As shown in FIG. 7, embodiment 700 is similar to embodiment 100 of FIG. 1. However, embodiment 700 employs single-ended signals.

In particular, FIG. 7 shows that embodiment 700 may include a front end module 102', an apparatus 701, and a demodulator 112'. Further, apparatus 701 may include a driver module 104', a filter module 106', an amplification module 108', and an adjustment signal source 110'. These elements correspond to elements in FIG. 1. However, the elements of FIG. 7 employ single-ended signals.

For instance, FIG. 7 shows front end module 102' receiving signal 119 through antenna 103. From this signal, front end module 102' produces a single-ended input signal 720. Input signal 720 may be at baseband. Thus, front end module 102' may perform a direct down-conversion (or direct conversion) of RF signal 119. Alternatively, input signal 720 may be at an intermediate frequency. To generate input signal 720, front end module 102' may include various components, such as a low noise amplifier (LNA), a band pass filter, and a mixer or detector circuit, and so forth.

Also, FIG. 7 shows driver module 104' receiving input signal 720 and generating corresponding signal 722 (also shown as $V_{IN}$). In turn, filter module 106' receives signal 722 and generates corresponding signal 724 (also shown as $V_i$). Amplification module 108' generates amplified signal 726 (also shown as $V_{OUT}$), which is sent to demodulator 112'. Like signal 720, signals 722, 724, and 726 are single ended.

Various level shifts may occur within embodiment 700. Accordingly, FIG. 7 shows that adjustment signal source 110' may generate an adjustment signal 728 and/or an adjustment signal 730 to control (e.g., diminish) the effects of such level shifts on signal 726.

Figure 8:
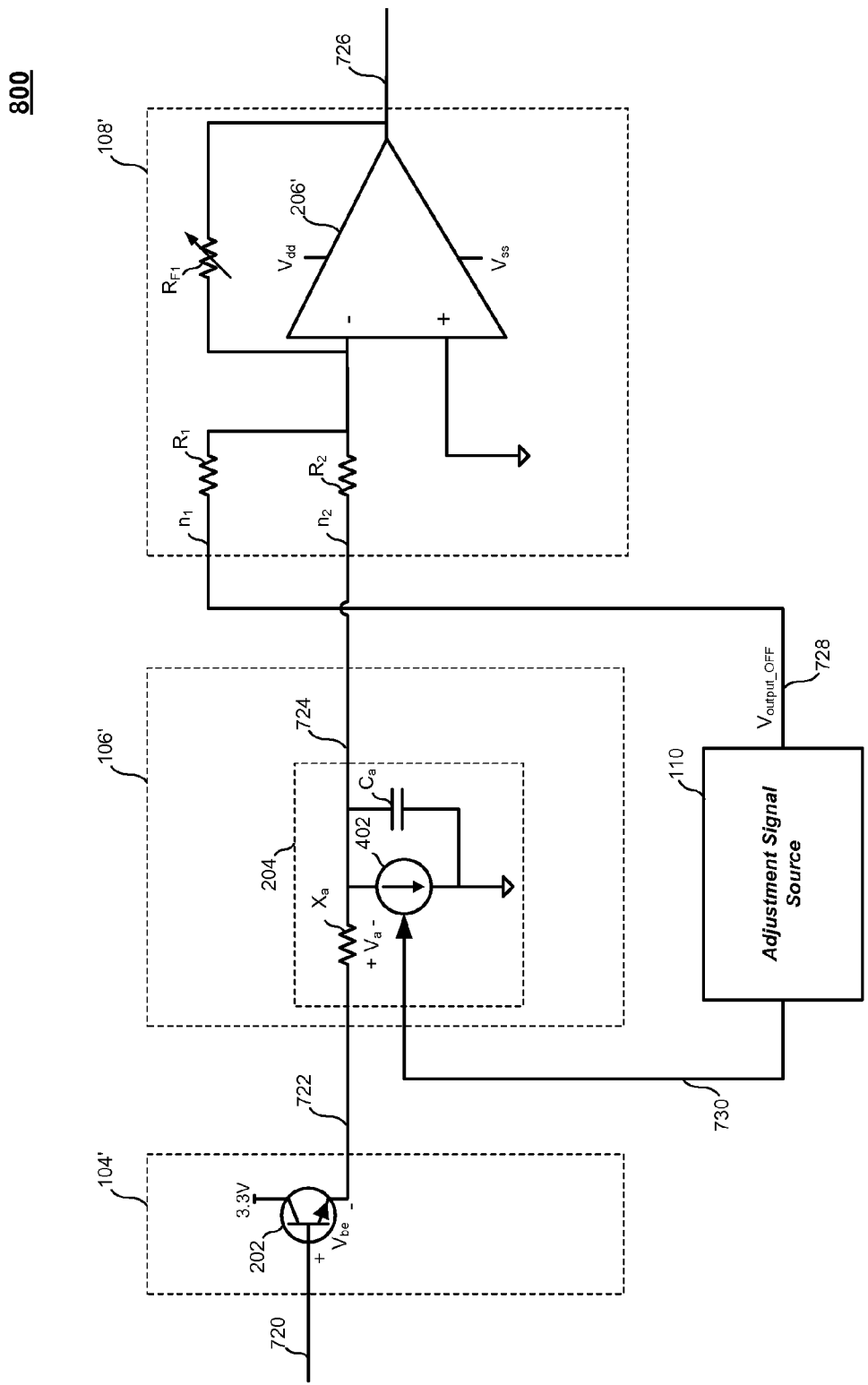
FIG. 8 is a diagram of a further apparatus implementation.

FIG. 8 is a diagram showing an exemplary implementation 800 of apparatus 701. This implementation is similar to the implementation of FIG. 4. However, driver module 104' and filter module 106' do not include duplicate circuitry to handle balanced or differential signals. Also, amplification module 108' includes an op-amp 206' which is configured to generate amplified signal 726 based on signal 724 and 728 according to the techniques described herein.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Thus, while the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus, comprising:
a filter module configured to generate a filtered signal based on a received signal, said filter module comprising a resistance and a variable current source configured to provide an amount of current through the resistance, the filtered signal having a level shift corresponding to a difference between a direct current (DC) level of the filtered signal and a DC level of the received signal, and the level shift comprising a voltage across the resistance corresponding to the current through the resistance;
an adjustment signal source to provide an adjustment signal, wherein the adjustment signal controls an effect of the level shift on a DC level of an amplified signal; and
an amplification module configured to generate the amplified signal from the filtered signal and the adjustment signal;
said adjustment signal source being configured to provide a further adjustment signal to set the amount of current through the resistance, and the filtered signal being based on the received signal and the further adjustment signal.

2. The apparatus of claim 1, wherein the amplification module comprises:
an operational amplifier (op-amp) having an input terminal;
a first resistance coupled between the input terminal and a first node to receive the filtered signal; and
a second resistance coupled between the input terminal and a second node to receive the adjustment signal.

3. The apparatus of claim 2, wherein the amplification module further comprises:
an output terminal; and
a third resistance coupled between the input terminal and the output terminal.

4. The apparatus of claim 1, wherein the filter module comprises a low pass filter.

5. The apparatus of claim 1, wherein the filter module comprises a band pass filter.

6. The apparatus of claim 1, further comprising a front end module to generate the received signal from a wireless radio frequency (RE) signal.

7. The apparatus of claim 1, wherein the received signal, the filtered signal, the amplified signal, and the adjusted filtered signal are each differential signal components.

8. The apparatus of claim 1, wherein the adjustment signal diminishes the effect of the level shift on the DC level of the amplified signal.

9. A method, comprising:
generating a filtered signal from a received signal using a filter module, the filter module comprising a resistance and a variable current source configured to provide an amount of current through the resistance, the filtered signal having a level shift corresponding to a difference between a direct current (DC) level of the filtered signal and a DC level of the received signal, the level shift comprising a voltage across the resistance corresponding to the current through the resistance;
providing an adjustment signal to control an effect of the level shift on a DC level of an amplified signal using an adjustment signal source; and
configuring an amplification module to generate the amplified signal from the filtered signal and the adjustment signal; and
configuring the adjustment signal source to provide a further adjustment signal to set the amount of current through the resistance, and based upon the received signal and the further adjustment signal.

10. The method of claim 9, wherein the adjustment signal is to diminish the effect of the level shift on the DC level of the amplified signal.

11. An apparatus, comprising:
a filter circuit configured to generate a filtered signal based on a received signal, said filter circuit comprising a resistance and a variable current source configured to provide an amount of current through the resistance and receive a further adjustment signal to set the amount of current through the resistance, the filtered signal having a level shift corresponding to a difference between a direct current (DC) level of the filtered signal and a DC level of the received signal, and the level shift comprising a voltage across the resistance corresponding to the current through the resistance;

an operational amplifier (op-amp) including an input terminal and an output terminal;

a first resistance coupled between the input terminal and a first node to receive the filtered signal;

a second resistance coupled between the input terminal and a second node to receive an adjustment signal; and a third resistance coupled between the input terminal and the output terminal;

the filtered signal being based on the received signal and the further adjustment signal.

12. The apparatus of claim 11, wherein the received signal is a baseband signal and the filter circuit comprises a low pass filter.

13. The apparatus of claim 11, wherein the received signal is an intermediate frequency (IF) signal and the filter circuit comprises a band pass filter.

14. An apparatus, comprising:

a filter module configured to generate a filtered signal based on a received signal, said filter module comprising a resistance and a variable current source configured to provide an amount of current through the resistance, the filtered signal having a level shift corresponding to a difference between a direct current (DC) level of the filtered signal and a DC level of the received signal;

an adjustment signal source to provide an adjustment signal, wherein the adjustment signal controls an effect of the level shift on a DC level of an amplified signal; and a driver circuit coupled to the filter module and comprising an emitter follower circuit having an input node and an output node, the level shift comprising a voltage across the input node and the output node; and an amplification module to generate the amplified signal from the filtered signal and the adjustment signal;

said adjustment signal source being configured to provide a further adjustment signal to set the amount of current through the resistance, and the filtered signal being based on the received signal and the further adjustment signal.

15. The apparatus of claim 14, wherein the amplification module comprises:

an operational amplifier (op-amp) having an input terminal;

a first resistance coupled between the input terminal and a first node to receive the filtered signal; and a second resistance coupled between the input terminal and a second node to receive the adjustment signal.

16. The apparatus of claim 15, wherein the amplification module further comprises:

an output terminal; and a third resistance coupled between the input terminal and the output terminal.

* * * * *